United States Patent [19]
Fuerst et al.

[11] Patent Number: 6,086,384
[45] Date of Patent: Jul. 11, 2000

[54] METHOD OF FABRICATING ELECTRONIC DEVICE EMPLOYING A FLAT FLEXIBLE CIRCUIT AND INCLUDING THE DEVICE ITSELF

[75] Inventors: Robert M. Fuerst, Maple Park; Todd A. Hester, Montgomery; Fred Love Krehbiel, Chicago, all of Ill.

[73] Assignee: Molex Incorporated, Lisle, Ill.

[21] Appl. No.: 08/915,347

[22] Filed: Aug. 22, 1997

[51] Int. Cl.⁷ .................................................. H01R 1/00
[52] U.S. Cl. ............................................. 439/67; 439/77
[58] Field of Search ........................................ 439/67, 77

[56] References Cited

U.S. PATENT DOCUMENTS

| | | | |
|---|---|---|---|
| 4,019,798 | 4/1977 | Zielinski | 439/67 |
| 4,970,624 | 11/1990 | Arneson et al. | 361/398 |
| 5,141,455 | 8/1992 | Ponn | 439/620 |
| 5,242,318 | 9/1993 | Plass | 439/620 |
| 5,266,054 | 11/1993 | Duncan et al. | 439/620 |
| 5,286,221 | 2/1994 | Fencl et al. | 439/607 |
| 5,384,435 | 1/1995 | Fuerst et al. | 174/262 |
| 5,456,616 | 10/1995 | Fuerst et al. | 439/620 |
| 5,632,630 | 5/1997 | Card et al. | 439/67 |
| 5,876,215 | 3/1999 | Biernath et al. | 439/67 |

*Primary Examiner*—Renee Luebke
*Assistant Examiner*—T. C. Patel
*Attorney, Agent, or Firm*—Stacey E. Caldwell

[57] ABSTRACT

A method of fabricating an improved electronic device, along with the product of that method is disclosed. A flat flexible substrate is provided with a generally round hole of a given diameter and with a conductive film on the substrate in an area at least about the hole. A generally round terminal pin is provided with a given diameter greater than that of the hole. The difference between the diameter of the pin and the diameter of the hole is on the order of 5% to 50% of the diameter of the hole. A non-conductive adhesive is applied to a portion of the pin or the substrate surrounding the hole. The pin is inserted into the hole in the substrate such that the non-conductive adhesive is scraped longitudinally from or along the pin to an area about the hole and the pin, leaving the pin in contact with the conductive film. An improved interface is established between the pin and the conductive film of the substrate.

12 Claims, 4 Drawing Sheets

METHOD OF FABRICATING ELECTRONIC DEVICE EMPLOYING A FLAT FLEXIBLE CIRCUIT AND INCLUDING THE DEVICE ITSELF

FIELD OF THE INVENTION

This invention generally relates to the art of electrical connectors and, particularly, to an electrical connector or electronic device including a flat flexible circuit, such as a flat flexible capacitor filter circuit or the like, wherein terminals pins are electrically coupled through holes in the flexible circuit.

BACKGROUND OF THE INVENTION

A variety of electrical connectors are designed for utilization with a flat flexible circuit which may be mounted directly on the connector or connected in circuit with terminal pins on the connector. Generally, a flat flexible circuit includes a flat flexible dielectric substrate having one or more holes therein for receiving one or more terminal pins. A ductile conductive film or other circuit trace system is deposited on the substrate in an area at least about the hole or holes. The terminal pins are inserted into the holes in the substrate to establish electrical and mechanical connections between the pins and the flat flexible circuit. Normally, each hole is smaller in diameter than a respective pin. Alternatively, the pin may be punched through the flat flexible circuit to establish the electrical and mechanical connection therewith.

In order to assure good electrical and mechanical connections in these types of electronic devices or electrical connectors, solder or other adhesives often are used. For instance, in U.S. Pat. No. 4,970,624, dated Nov. 13, 1990 and assigned to the assignee of the present invention, uni-axial adhesive is deposited on the flat flexible circuit about the hole which is penetrated by the terminal pin. The adhesive includes a non-conductive base incorporating randomly spaced conductive particles. When the terminal pin is forced through the adhesive, a portion of the adhesive is carried with the terminal pin between the pin and the flat flexible circuit. The carried portion of the adhesive is compressed for establishing contact between the conductive particles and, thereby, conductivity between the terminal pin and the flat flexible circuit, leaving the adhesive other than that portion in a non-conductive state. Such adhesives often are called "Z-axis" adhesives. These adhesives were developed to replace soldering techniques which requires specific temperature resistant components and substrates.

Conductive adhesives are used in other applications involving flat flexible circuits. For instance, in U.S. Pat. No. 5,456,616, dated Oct. 10, 1995 and assigned to the assignee of the present invention, the connector housing is fabricated of a die cast metallic material, such as of magnesium, aluminum or the like. The ductile film on the flat flexible circuit is fabricated of a different metallic material, such as copper or the like and, in fact, may be plated with still a different metallic material such as a tin/lead alloy. The conductive film on the flat flexible circuit acts as a ground plane against the rear face of the connector housing. The housing has a plurality of pins which project through holes in the flat flexible circuit. Using a "Z-axis" adhesive between the housing pins and the flat flexible circuit not only is expensive, as described above, but the conductive interface between the different metal components is limited to the areas of pressure. Consequently, that patent teaches the use of an omni-directional conductive adhesive deposited on the conductive film over the areas of the holes therein, the conductive adhesive expanding the conductive interface between the metal housing and the metal ground plane defined by the conductive film.

Although such uses of conductive adhesives, whether the adhesives are Z-axis adhesives or omni-directional adhesives, serve their intended purposes in certain applications, they are relatively expensive both in the cost of the adhesives as well as their methods of use. In addition, the use of either type of conductive adhesive is costly in terms of secondary operations and costs associated with the metal particles, not to mention the problem of clogging adhesive dispensers by the metallic particles.

Because of the problems associated with the use of conductive adhesives, a unique system was devised as disclosed in U.S. Pat. No. 5,384,435, dated Jan. 24, 1995 and assigned to the assignee of the present invention. That patent solves the problems with conductive adhesives by establishing an electrical connection directly between the terminal pin and the flat conductor on the flat flexible substrate by controlling various parameters between the pin and the substrate. Although this system has proven quite effective, however, because of some of the environments in which this type of connection is used, such as in high vibration or thermal cycling environments, there remains a continuing problem of providing good electrical connections between terminal pins and the conductive film of a flat flexible circuit without resorting to the expensive conductive adhesives described above. The present invention is directed to solving these problems.

SUMMARY OF THE INVENTION

An object, therefore, of the invention is to provide a new and improved system for mounting electrical terminals, such as terminal pins, in flat flexible circuitry.

In the exemplary embodiment of the invention, a method of fabricating such an electronic device is disclosed. The method includes the steps of providing a flat flexible dielectric substrate less than 0.050 inch thick with a generally round hole of a given diameter and with a ductile conductive film on the substrate in an area at least about the hole. A generally round terminal pin is provided with a given diameter greater than that of the hole wherein the difference between the diameter of the pin and the diameter of the hole is on the order of 5% to 50% of the diameter of the hole. A non-conductive adhesive is applied to least a portion of the pin or a portion of the substrate surrounding the hole. The pin is inserted into the hole in the substrate such that the non-conductive adhesive is scraped longitudinally from or along the pin to an area about the hole and the pin, leaving the pin in contact with the conductive film.

As disclosed herein, the hole may be prepunched in the substrate. The conductive film and the terminal pin may be plated with a common conductive plating material, such as a tin/lead material, providing a similar metal interface, or the conductive film and the terminal pin may be plated with dissimilar conductive plating materials. The base of the conductive film may be of copper material. The substrate may be provided of such materials as polyimide or polyester.

The invention also contemplates a product fabricated in accordance with the above method.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims.

The invention, together with its objects and the advantages thereof, may be best understood by reference to the following description taken in conjunction with the accompanying drawings, in which like reference numerals identify like elements in the figures and in which.

DETAILED DESCRIPTION OF THE PREFERRED EMBODIMENT

Figure 1:
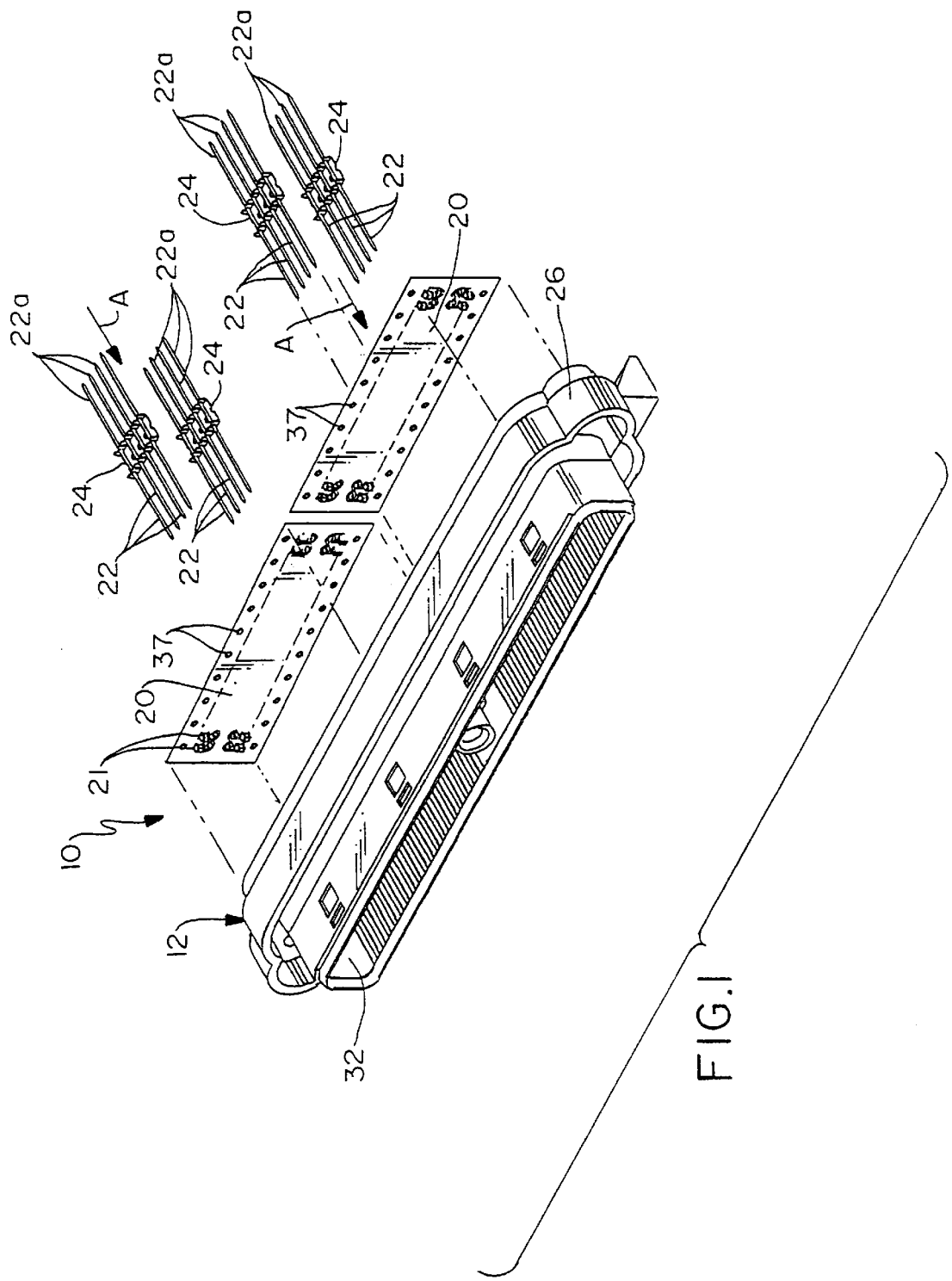
FIG. 1 is an exploded perspective view of a multi-terminal filtered electrical connector assembly incorporating the invention.

Referring to the drawings in greater detail, and first to FIG. 1, the invention is incorporated in a multi-terminal filtered electrical connector assembly, generally designated 12. A pair of flexible capacitor filter circuits, generally designated 20, are mounted to the rear of connector 12, as described in greater detail hereinafter. A plurality of terminals 22 are mounted in connector 12 and are assembled, through flexible capacitor filter circuits 20, to connector 12 in the direction of arrows "A". An alternative method is to mount the pins first and then to press the flexible circuits over the pins. Each flexible capacitor filter circuit has a plurality of chip capacitors 21 operatively associated with the terminals passing therethrough. Each terminal 22 includes a tail portion 22a. For illustration purposes, FIG. 1 shows groups of terminals 22 retained on bandolier holders 24 which simply are used temporarily for inserting the terminals into main connector 12 in the direction of arrows "A". Although only sixteen terminals are shown in groups of four, connector 12 can mount as many as 160 or more terminals.

Figure 2:
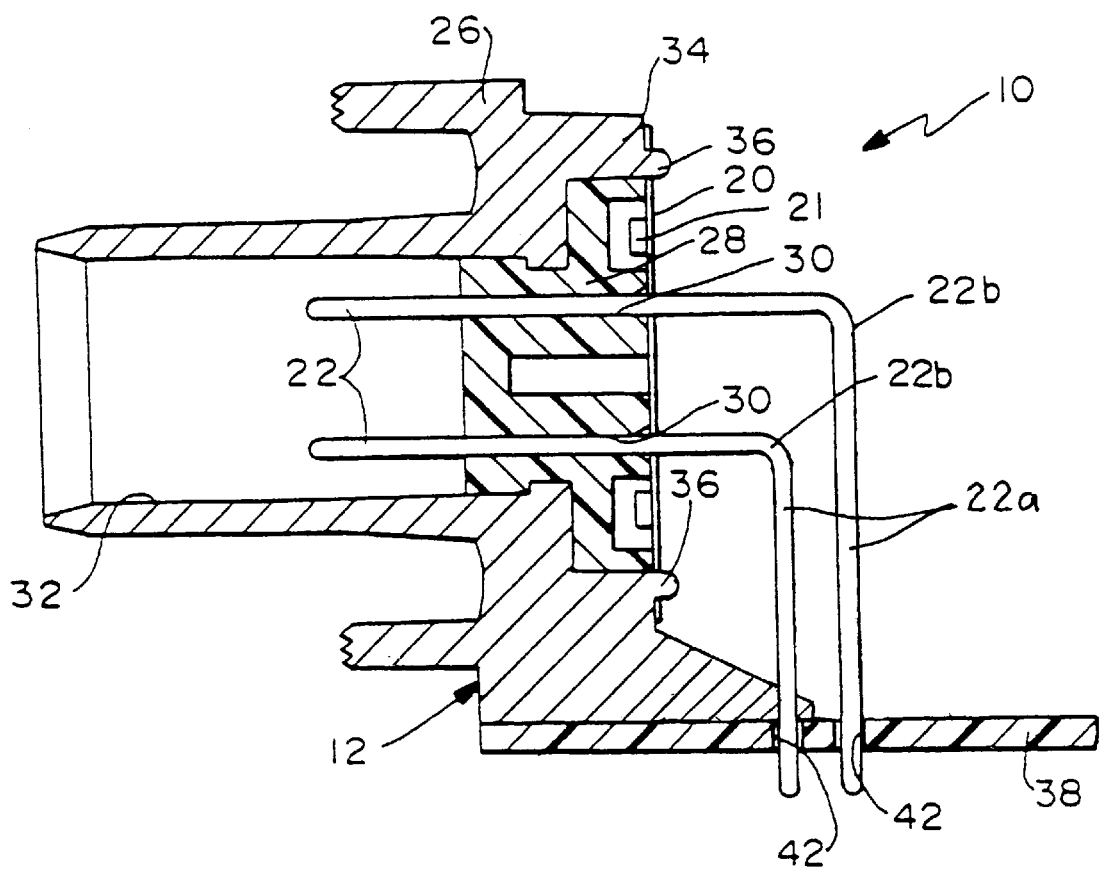
FIG. 2 is a vertical section, on an enlarged scale, through the connector assembly and with the assembly mounted to a printed circuit board.

Referring to FIG. 2 in conjunction with FIG. 1, connector 12 includes a die cast housing 26 having an injection molded dielectric insert 28. The housing, through insert 28, includes a plurality of through passageways 30 for receiving terminals 22 whereby forward mating ends of the terminals are exposed in a cavity 32 of the housing. The cavity is provided for receiving a complementary electrical connector assembly (not shown) which have female terminals for interengagement with terminals 22. Die cast housing 26 defines a rear face 34 thereof, with a plurality of mounting pins 36 projecting from the rear face for insertion into mounting holes 37 in flexible capacitor filter circuits 20 to mount the circuits to the rear of the housing and establish electrical contact between the housing and the flexible circuits.

Still referring to FIG. 2 in conjunction with FIG. 1, it can be seen that connector 12, particularly die cast housing 26, is constructed to provide a right angle connector mountable to a printed circuit board 38, with terminals 22 extending through passageways 30 generally parallel to the printed circuit board. It can be seen that terminals 22 are bent at right angles, as at 22b, so that tail portions 22a of the terminals extend perpendicular to printed circuit board 38 for insertion into appropriate holes 42 in the circuit board for interconnection to appropriate circuit traces on the board or in the holes. Terminals 22 may also be provided in a straight or vertical orientation to provide an in-line or vertical connector mountable to printed circuit board 38.

Figure 3:
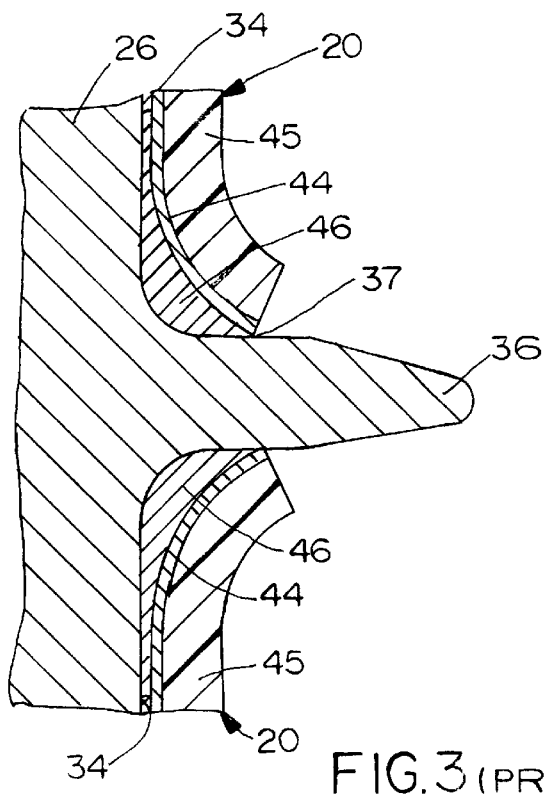
FIG. 3 is an enlarged section through a housing pin projecting through the flat flexible circuit, according to a system of the prior art.

Referring to FIG. 3 in conjunction with FIGS. 1 and 2, one of the mounting pins 36 of die cast housing 26 is shown projecting through a hole 37 in flat flexible circuit 20. More particularly, the flat flexible circuit includes a flat dielectric substrate 45 which may be of various materials, but a polyimide material marketed by Du Pont Corporation under the trademark KAPTON has proven effective. Other materials, such as a polyester material marketed under the trademark MYLAR also could be used. Hole 37 may be provided as a prepunched, generally round hole for receiving a round pin such as pin 36.

A ductile conductive film or flat conductor 44 is deposited on substrate 45 in an area at least about hole 37. In the embodiment illustrated herein, the film 44 substantially covers dielectric substrate 45 (i.e. flat flexible circuit 20) and acts as a ground plane for the connector assembly. The film may be of copper or like material and may be plated with a tin/lead alloy-like material or precious metal.

According to a prior art system, a conductive adhesive 46 is deposited on conductive film 44 over the area of the hole in substrate 45 of flat flexible circuit 20 or on the pin 36 and the area of the housing around the pin. The adhesive is an omni-directional adhesive (versus a "Z-axis" adhesive) and includes a nonconductive base or resin incorporating conductive particles therein. Since the adhesive is omni-directional, it is not limited in its areas of conductivity to points of pressure as in "Z-axis" adhesives. Therefore, the omni-directional adhesive can improve the conductive interface between the metal pin/housing and the metal ground plane in certain applications. The adhesive includes in excess of twenty-five percent by weight content of conductive particles. Other details of this prior art adhesive system, as well as further details of filtered electrical connector assembly 10, can be derived from the aforementioned U.S. Pat. No. 5,456,616, as well as U.S. Pat. No. 5,286,221, dated Feb. 15, 1994 and assigned to the assignee of the present invention, both of which are incorporated herein by reference.

Figure 4:
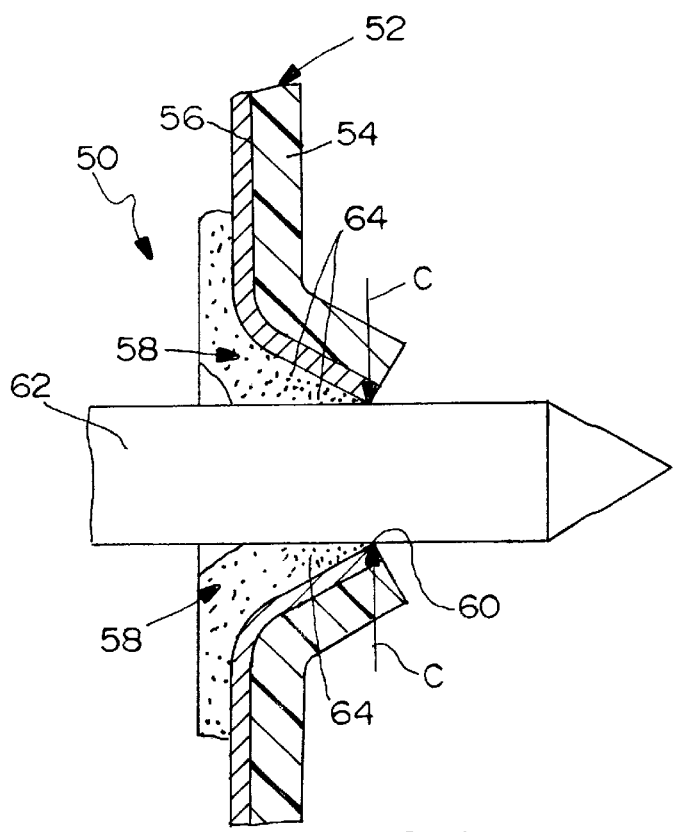
FIG. 4 is an enlarged section through an interconnection between a terminal pin and a flat flexible circuit according to a system of the prior art.

FIG. 4 shows another system of the prior art wherein an electronic device, generally designated 50, includes a flat flexible circuit, generally designated 52, having a flat flexible dielectric substrate 54 with a ductile conductive film 56 thereon. A "Z-axis" adhesive 58 is deposited about a hole 60 in the flat flexible circuit. A terminal pin 62 is forced through the adhesive and through hole 60 in the flat flexible circuit.

In the prior art system of FIG. 4, conductive adhesive 58 includes a non-conductive base or resin incorporating randomly spaced conductive particles 64. In a normal state of concentration, the conductive particles are spaced sufficiently so that there is no conductivity through the adhesive in any direction. However, upon application of pressure to the adhesive in a given direction, the particles become concentrated in that direction (e.g., the "Z-axis") squeezing out the non-conductive resin in directions transverse to that axis. In FIG. 4, generally, the "Z" direction of pressure is indicated by arrows "C". The compressed conductive particles establish electrical contact between conductive film 56 and terminal pin 62. Other details of this prior art system can be derived from U.S. Pat. No. 4,970,624, dated Nov. 13, 1990, assigned to the assignee of the present invention and which is incorporated herein by reference.

Figure 5:
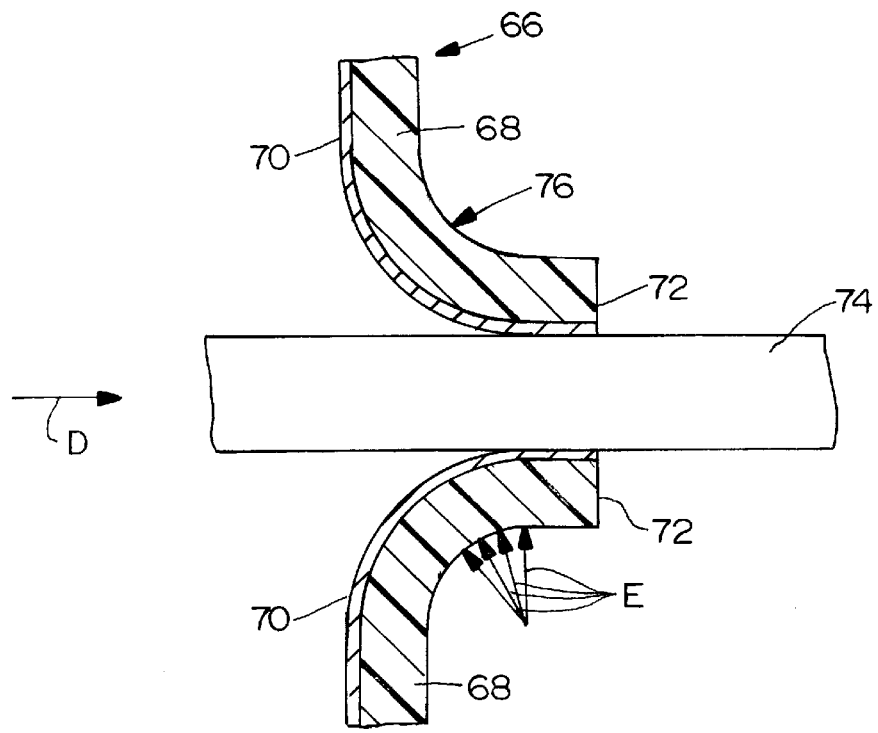
FIG. 5 is an enlarged section through an interconnection between a terminal pin and a flat flexible circuit according to another system of the prior art.

FIG. 5 shows a further system of the prior art wherein a flat flexible circuit, generally designated 66, includes a flat flexible dielectric substrate 68 having a ductile conductive film 70 thereon. The flat dielectric substrate is initially provided with a prepunched, generally round hole 72 of a given diameter. Substrate 28 is less than 0.050 inch thick. A terminal pin 74 is inserted through hole 72 to establish an electrical connection with conductive film 70. The terminal pin is generally round, and the term "round" to describe the cross-sectional configuration of terminal pin 74 and the configuration of hole 72 is not meant to be limited to a precise circular pin or hole. For instance, an elliptical pin may be inserted in a corresponding elliptical hole as long as the minor and major axes of the two elliptical configurations are aligned.

The prior art system of FIG. 5 contemplates the use of a principle which may be called a "controlled meniscus" as indicated at 76 in FIG. 5. In other words, in order to eliminate the use of solder, adhesives, epoxies and the like, a particular interference is established between terminal pin 74 and flat flexible circuit 66 in curved area 76 which, in essence, is a deformed peripheral area of the circuit which applies normal forces to the terminal pin in the direction of arrows "E" when the pin is inserted in the direction of arrow "D". It has been found that this area and the interference forces are controlled by controlling the relative diameters of terminal pin 74 and hole 72. In actual practice, it has been found that good electrical connections can be maintained when the difference between the diameter of terminal pin 74 and the diameter of hole 72 is on the order of 5% to 50% of the diameter of the hole. This could be termed the "interference" parameter. In actual practice, using this relationship, the following experimental results were found:

| Pin Diameter (x) | Hole Diameter (y) | Interference $\frac{x-y}{y}$ |
| --- | --- | --- |
| .080 inch | .062 inch | 29% |
| .060 inch | .050 inch | 20% |
| .040 inch | .028 inch | 43% |
| .040 inch | .031 inch | 29% |
| .040 inch | .035 inch | 14% |
| .040 inch | .038 inch | 5% |

These interference levels were maintained with substrate 68 being a polyimide film of either 0.005 inch thick or 0.002 inch thick, and with a one ounce copper film 70 having a tin/lead plating. Other details of this prior art system can be derived from U.S. Pat. No. 5,384,435, dated Jan. 24, 1995, assigned to the assignee of the present invention and which is incorporated herein by reference.

Figure 6:
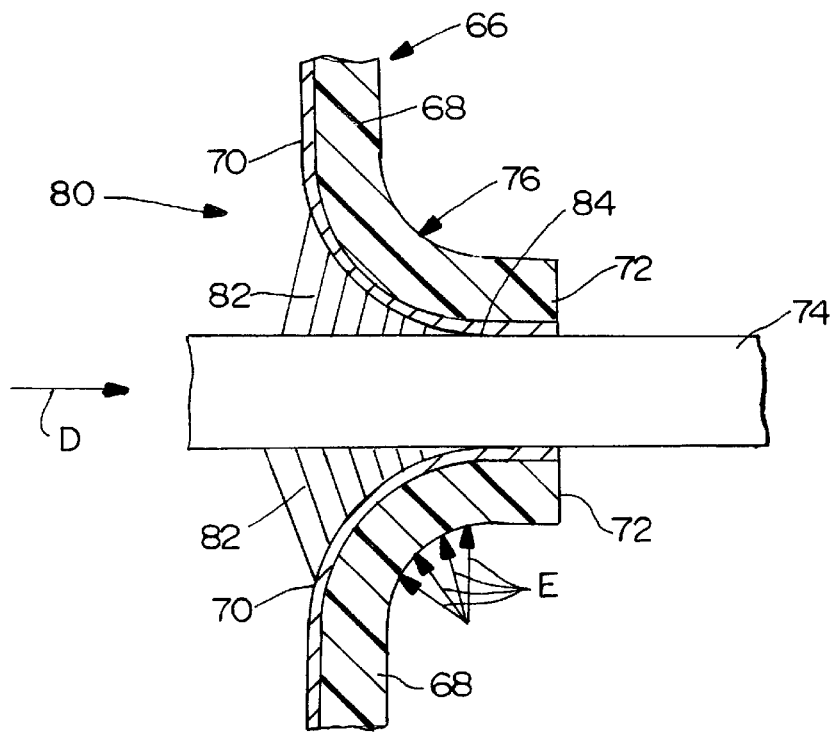
FIG. 6 is an enlarged section through an interconnection between a terminal pin and a flat flexible circuit according to the invention.

The prior system of FIG. 5 showed that secondary operations such as soldering the terminal pin to the flat conductor of the flat flexible circuit, or using epoxy or other adhesives between the pin and the flexible circuit can be completely eliminated and still maintain a good electrical connection between the pin and the flat conductor of the flexible circuit. However, the invention as shown in FIG. 6 has proven to provide surprising and unexpected results. In FIG. 6, like numerals have been applied to designate like elements or components described above and shown in the "controlled meniscus" system of FIG. 5.

More particularly, FIG. 6 shows an electronic device, generally designated 80, which includes flat flexible circuit 66 having flat flexible dielectric substrate 68 with generally round hole 72 and with ductile conductive film 70 thereon. Generally round terminal pin 74 is inserted through hole 72 in substrate 68 to establish an electrical connection with conductive film 70. Again, the difference between the diameter of pin 74 and the diameter of hole 72 is on the order of 5% to 50% of the diameter of the hole.

However, prior to inserting the pin into the hole, a non-conductive adhesive 82 is applied to a portion of pin 74 or substrate 68 surrounding hole 72. Upon inserting pin 74 into hole 72, the non-conductive adhesive is scraped longitudinally from or along the pin to an area about the hole and the pin, as seen by adhesive 82 in FIG. 6. The pin is then held in contact with conductive film 70, as at 84 in FIG. 6. The results of this system have been unexpected.

In other words, while the dimensional and material parameters of the prior art system of FIG. 5 are followed, a more secure connection is provided. Yet, the disadvantages of using conductive adhesives are overcome by using a non-conductive adhesive. That is, the terminal pin and the flat flexible circuit are held relatively rigid so that they move together in environments involving vibrations and thermal cycling and intermittencies are avoided. Furthermore, clogging of adhesive dispensers is prevented since the metallic particles of conductive adhesives are not present with non-conductive adhesive 82, and the costs associated with conductive adhesives and their secondary operations are alleviated. In essence, the results, i.e., that the electrical interface between the flat flexible circuit and the terminal pin are improved using a non-conductive adhesive, have been unexpected, since an adhesive alone, without any conductive particles therein, is insulative and therefore would logically be considered to interfere with a good electrical connection, i.e., an insulator or dielectric would seemingly increase contact resistance between the terminal pin and the flat flexible circuit. However, due to the relative diameters of the terminal pin and the hole in the flat flexible circuit, much of the epoxy is collected outside of the interface between the flat flexible circuit and the terminal pin (as shown in FIG. 6), and the mechanical interface between the pin and the flexible circuit is strengthened since the two components cannot move independently of one another. Even if some adhesive is present in the area of contact 84, portions of the pin will be in direct contact with the conductive film 70 and the adhesive will ensure that the film does not move independent of the pin and will keep the portions of the pin in contact with the conductive film. The adhesive therefore does not interfere with the electrical connection between the pin and conductive film 70. Rather, the product and its electrical interface is considerably enhanced by applying the non-conductive adhesive, totally contrary to the teachings of the prior art according to the system of FIG. 5.

The invention contemplates that a non-conductive adhesive can be applied to the pin prior to inserting the pin into the hole in the flexible circuit. The adhesive could alternatively be applied to the flexible circuit prior to the pin passing through the hole in the circuit.

The invention is not limited to applications in which the terminal pin 74 and conductive film 70 are plated with a particular conductive material. For instance, conductive film 70 may be of copper material and be plated with a tin/lead alloy. Terminal pin 74 can be plated with a similar tin/lead alloy to form a similar metal interface, or the pin can be plated with a dissimilar metal. Of course, other alloys, such as a tin/nickel alloy can be used. An unplated terminal pin could also be used.

Finally, it should be understood that although FIG. 6 shows only a single pin inserted into a single hole, the invention is applicable in multi-circuit electronic devices including a plurality of pins inserted individually or simultaneously into a corresponding plurality of holes, such as in flat flexible capacitor filter circuits 20 in FIGS. 1 and 2. In fact, a non-conductive adhesive can be applied to a plurality of terminals which can then be "gang" inserted simultaneously into a plurality of holes in the flexible circuit. Similarly, the terminals can be "gang" inserted into a flex circuit to which non-conductive adhesive has been applied.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. An electronic device, comprising:

a flat flexible dielectric substrate less than 0.050 inch thick having a generally round hole of a given diameter and with a ductile conductive film on the substrate in an area at least about said hole;

a generally round terminal pin inserted into the hole in the substrate in contact with the conductive film, the pin having a given diameter greater than that of the hole;

the difference between the diameter of the terminal pin and the diameter of the hole being on the order of 5% to 50% of the diameter of the hole; and a non-conductive adhesive between the conductive film and the terminal pin about the area of said hole;

wherein an improved electrical and mechanical interface is created between the pin and the conductive film in the area about said hole such that a portion of the pin is in contact with the conductive film and the adhesive fixedly holds the conductive film relative to the pin independent of additional holding elements.

2. The electronic device of claim 1 wherein said non-conductive adhesive is applied to the terminal pin in an inoperative condition prior to said insertion into the hole in the substrate.

3. The electronic device of claim 1 wherein said hole in the substrate is prepunched.

4. The electronic device of claim 1 wherein said substrate is fabricated of polyimide material.

5. The electronic device of claim 1 wherein said substrate is fabricated of polyester material.

6. The electronic device of claim 1 wherein said ductile conductive film is fabricated of copper.

7. The electronic device of claim 1 wherein said ductile conductive film is plated with a tin/lead material.

8. The electronic device of claim 1 wherein said terminal pin is plated with a tin/lead material.

9. The electronic device of claim 1 wherein said ductile conductive film is plated with a tin material.

10. The electronic device of claim 1 wherein said terminal pin is plated with a tin material.

11. The electronic device of claim 1 wherein said conductive film and said terminal pin are plated with a common conductive plating material to provide a similar metal interface.

12. The electronic device of claim 1 wherein said conductive film and said terminal pin are plated with different conductive plating materials to provide a dissimilar metal interface.

* * * * *